United States Patent [19]

Chadwick et al.

[11] E Re. 29,784

[45] Reissued Sep. 26, 1978

[54] THERMAL DISSIPATING METAL CORE PRINTED CIRCUIT BOARD

[75] Inventors: Donald H. Chadwick, Northbridge; Ruben T. Apodaca, Inglewood, both of Calif.

[73] Assignee: International Electronics Research Corp., Burbank, Calif.

[21] Appl. No.: 483,972

[22] Filed: Jun. 28, 1974

Related U.S. Patent Documents

Reissue of:

[64] Patent No.: 3,514,538
Issued: May 26, 1970
Appl. No.: 772,672
Filed: Nov. 1, 1968

U.S. Applications:

[63] Continuation of Ser. No. 370,792, Jun. 18, 1973, abandoned, which is a continuation of Ser. No. 131,102, Apr. 5, 1971, abandoned.

[51] Int. Cl.[2] ..... H05K 1/00
[52] U.S. Cl. ..... 174/68.5
[58] Field of Search ..... 174/68.5, 52 PE, 153 R; 317/101 B, 101 C, 101 CC, 100; 204/15; 156/3, 150; 29/625, 626, 627

[56] References Cited

U.S. PATENT DOCUMENTS

| | | | |
|---|---|---|---|
| 2,768,293 | 10/1956 | Kepple et al. | 74/68.5 X |
| 2,848,359 | 8/1958 | Talmey | 174/68.5 X |
| 2,940,018 | 7/1960 | Lee | 174/68.5 X |
| 3,155,770 | 3/1964 | Hollenden et al. | 174/153 R |
| 3,206,342 | 9/1963 | Briggs | 174/68.5 X |
| 3,264,524 | 8/1966 | Dahlgren et al. | 174/68.5 X |
| 3,296,099 | 1/1967 | Dinella | 174/68.5 X |
| 3,652,333 | 3/1972 | Warren | 174/68.5 X |

FOREIGN PATENT DOCUMENTS 892,451 3/1962 United Kingdom.

*Primary Examiner*—Arthur T. Grimley

[57] ABSTRACT

A metal core printed circuit board which includes multiple layers of synthetic plastic resin material on a sheet of metal, and wherein the surface of the plastic material is of such character that it provides an acceptable bond on which are built up sundry layers of different metals, the innermost layer on the plastic surface and the other layers positioned one upon another, ultimately comprising a built up circuit pattern, and wherein areas intermediate the circuit pattern comprise an exposed surface of the resin material.

8 Claims, 18 Drawing Figures

FIG. 18.
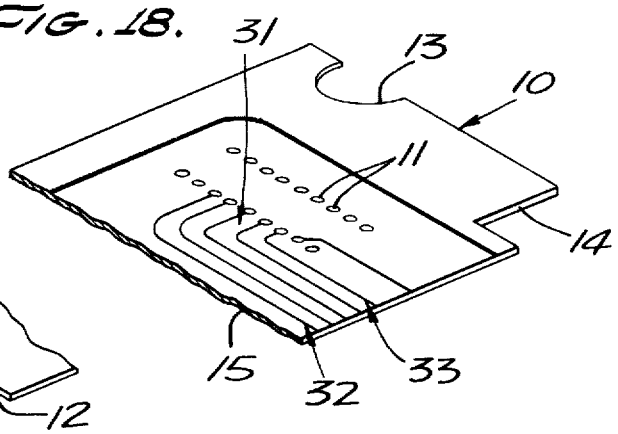
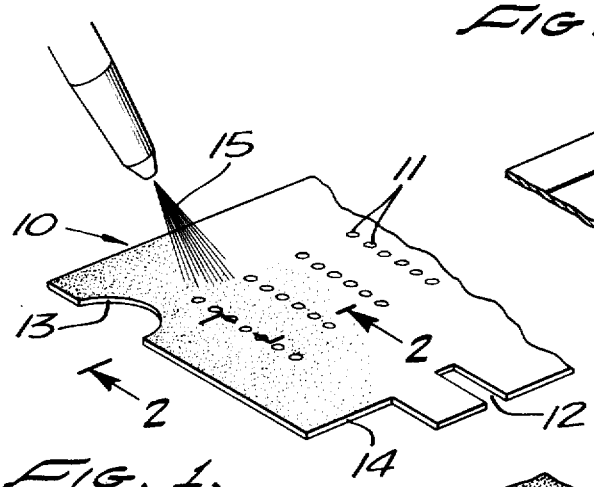
FIG. 1.
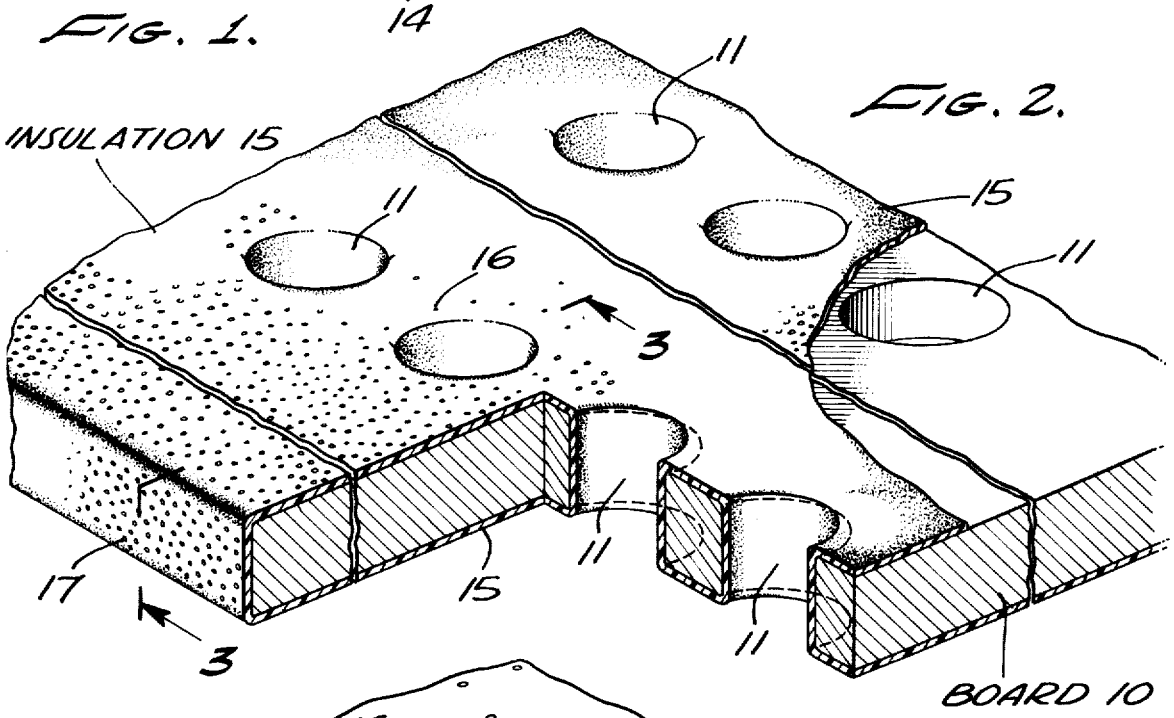
FIG. 2.
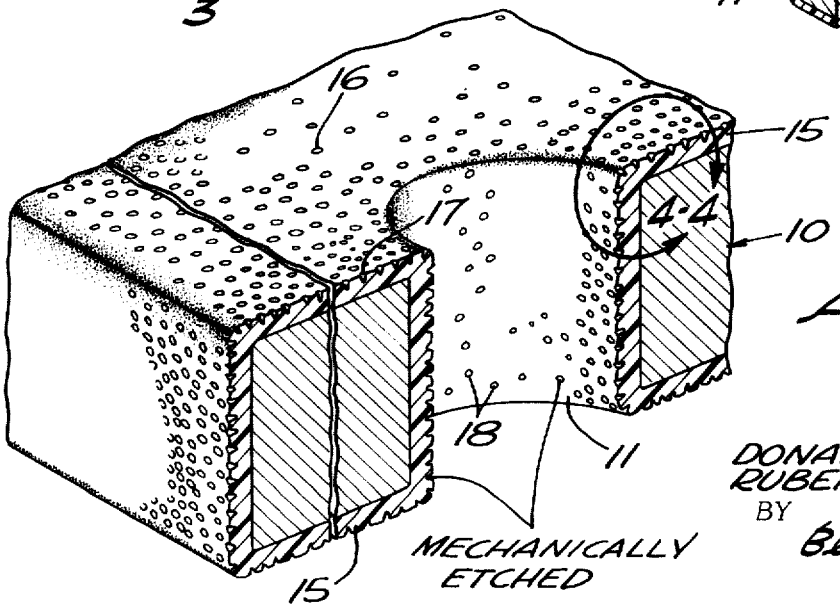
FIG. 3.
INVENTORS
DONALD H. CHADWICK
RUBEN T. APODACA
BY
Beehler & Arant
ATTORNEYS FIG. 4.
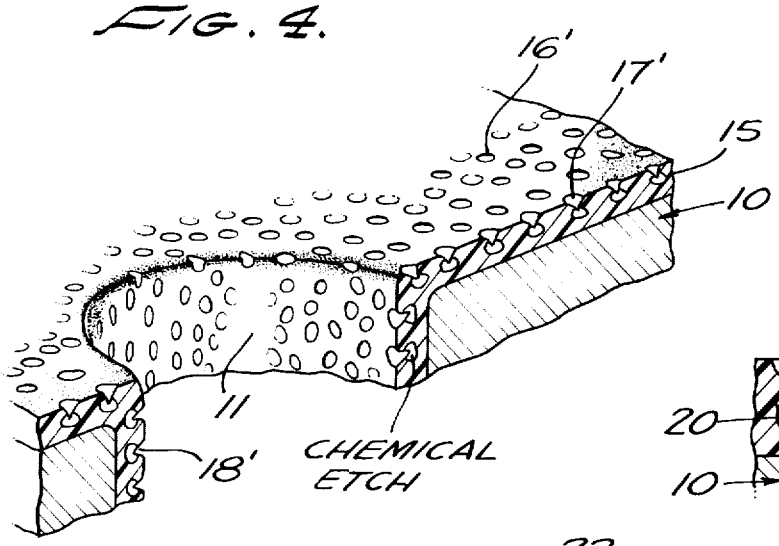
FIG. 5.
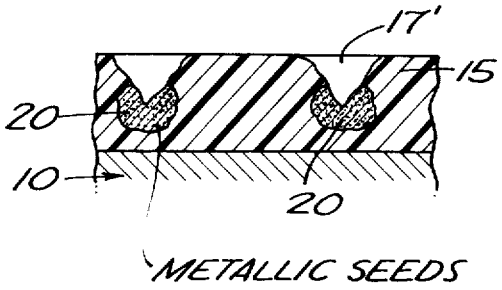
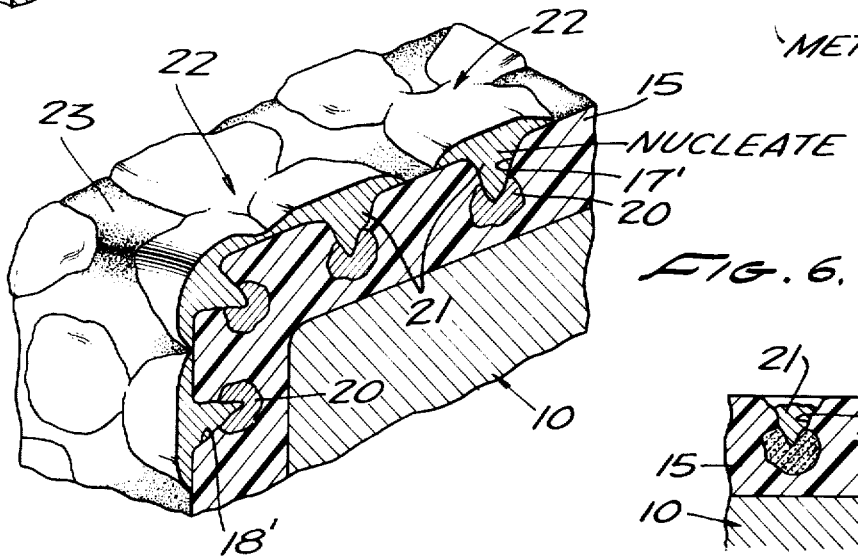
FIG. 6.
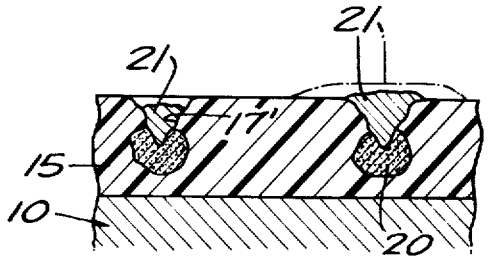
FIG. 7.
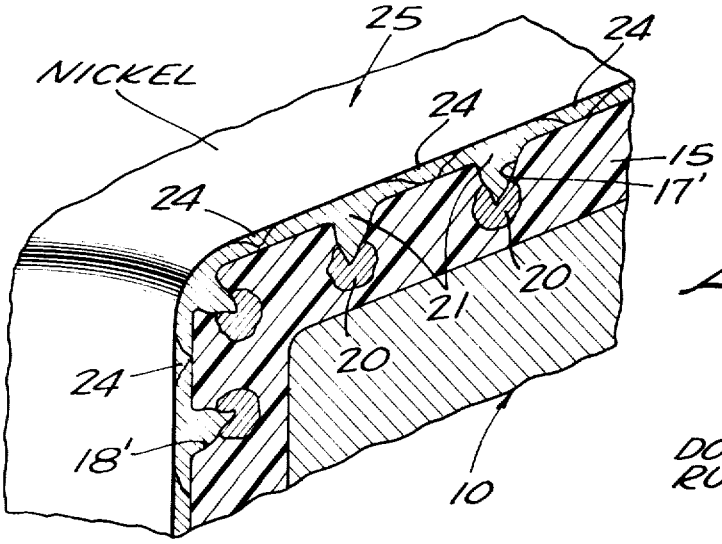
FIG. 8.
INVENTORS
DONALD H. CHADWICK
RUBEN T. APODACA
BY
Beehler & Arant
ATTORNEYS INVENTORS
DONALD H. CHADWICK
RUBEN T. APODACA
BY
Beehler & Arant
ATTORNEYS INVENTOR.
DONALD H. CHADWICK
RUBEN T. APODACA
BY
Beehler & Arant
ATTORNEYS FIG. 15.
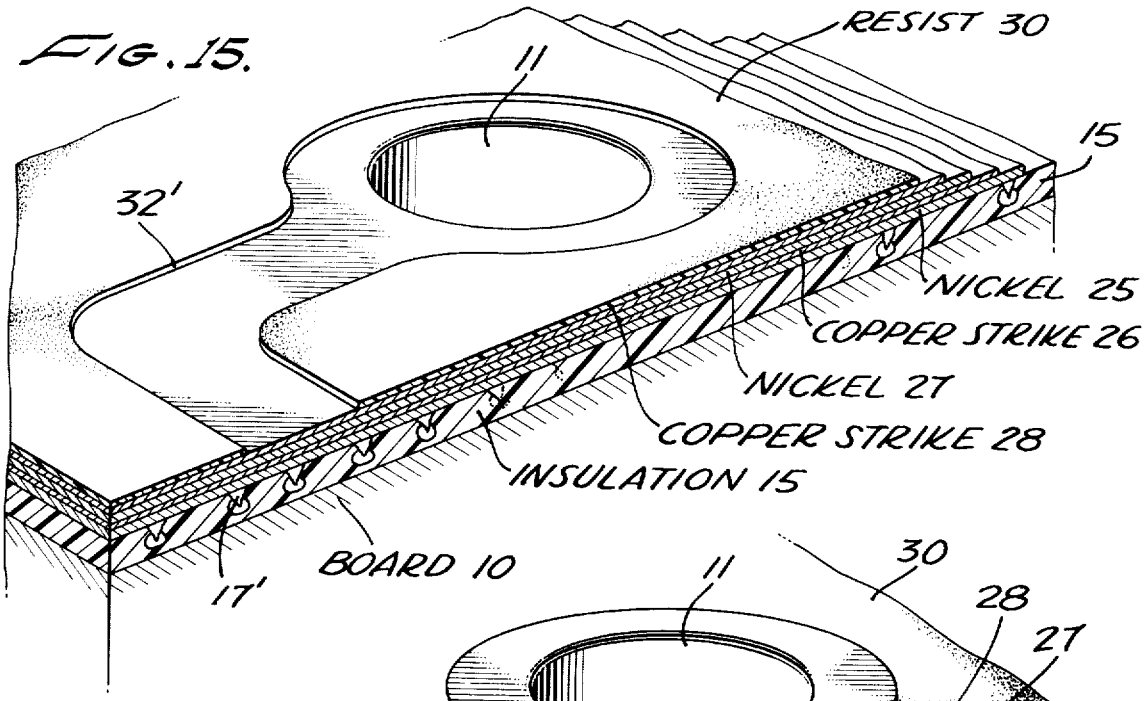
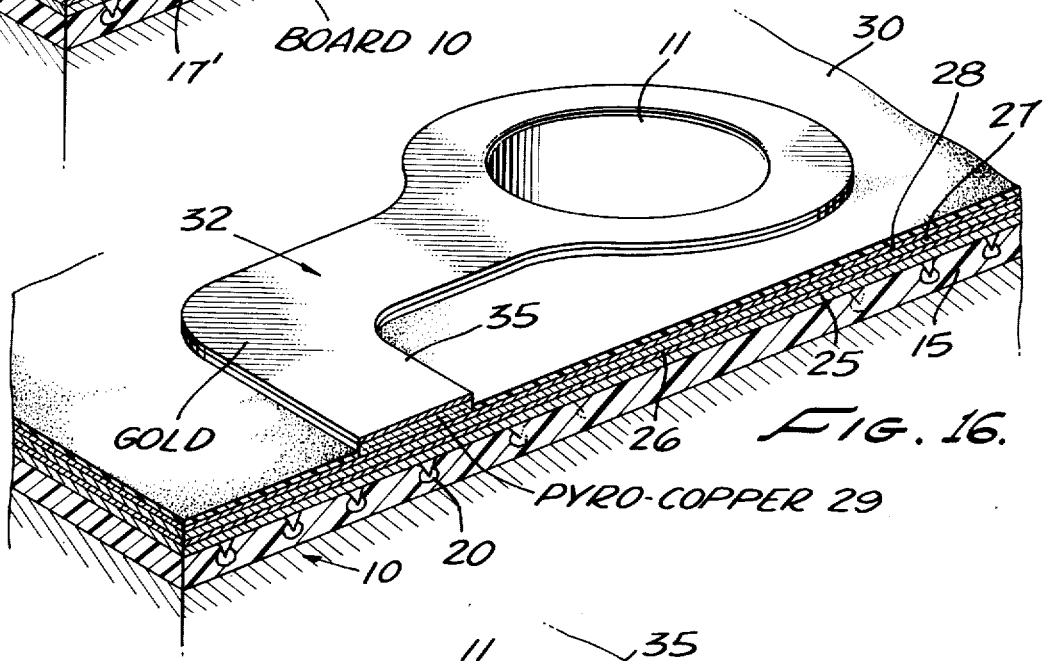
FIG. 16.
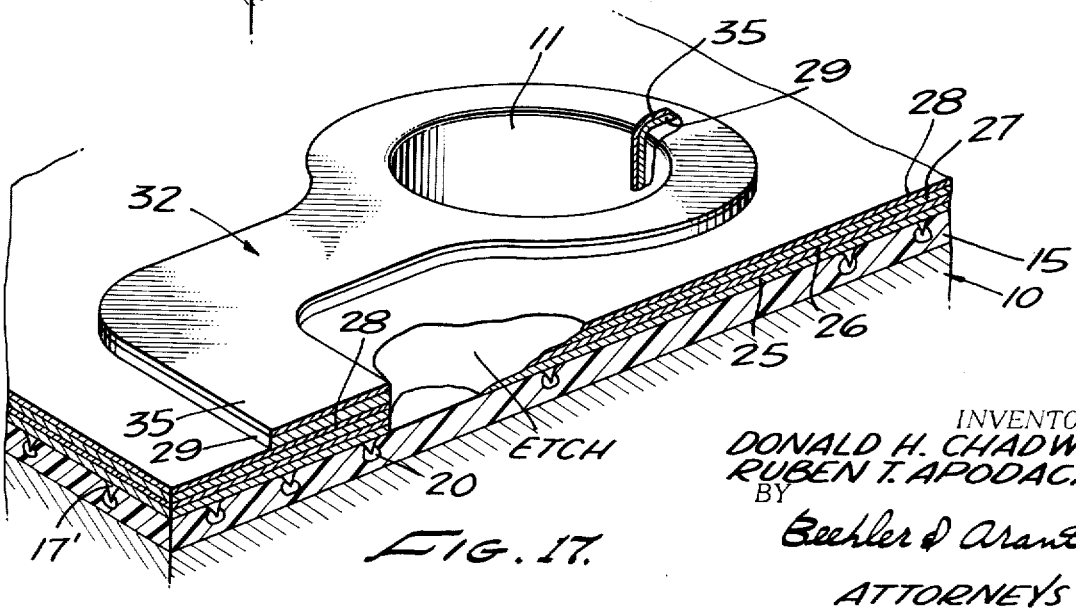
FIG. 17.
INVENTORS
DONALD H. CHADWICK
RUBEN T. APODACA
BY
Beehler & Arant
ATTORNEYS

THERMAL DISSIPATING METAL CORE PRINTED CIRCUIT BOARD

Matter enclosed in heavy brackets [ ] appears in the original patent but forms no part of this reissue specification; matter printed in italics indicates the additions made by reissue.

This application is a continuation of application Ser. No. 370,792, filed June 18, 1973 now abandoned, which was a continuation of reissue Ser. No. 131,102, filed Apr. 5, 1971 now abandoned.

Due to the fact that printed circuits are necessarily electrically conducting metallic lines applied to some appropriate surface, the surface upon which such lines are placed must be electrically nonconducting.

Heretofore the practice almost universally pervalent has been to make use of a board or sheet which itself is of nonconducting material, the surface of that material being one on which metal lines have been printed and built up to a sufficient thickness throughout the circuit pattern to provide a mechanically stable circuit, and wherein those portions intermediate the circuit pattern have been etched away to leave only the circuit pattern.

Although circuit boards possessed of a core comprising a sheet of naturally electrically nonconducting material have been widely used and have been highly effective, they lack the desirable property of being capable of quickly and effectively dissipating heat which is generated by components in the circuit when the apparatus in which they are used is operated. This situation has progressively become more critical as circuits and components have become smaller, especially those of micro-miniature size, in that compaction of the components and circuits into increasingly smaller spaces diminishes the amount of space available around them for the circulation of cooling whereby to keep the temperature of the electrical apparatus when operating at a desirable minimum.

In recent years some developers have undertaken to make use of metal cores for circuit boards. Typical developments have materialized in the issue of certain patents among which are: Eisler, 2,706,697; Gellert, 3,165,672; Dinella, 3,296,099.

Although the developments mentioned have undertaken to make use of some form of dielectric material for coating the surfaces of the metallic sheet or core, dielectric materials which heretofore have been made use of have been hard to handle, difficult to apply in a manner assuring an adequate bond and hard to prepare in such fashion that the electric circuit pattern, once applied to them, will be durable as well as precisely dependable, to the degree required by complex electronic circuitry. The high expense of adequately treating a metallic board to accept a satisfactory circuit pattern has been an additional deterring factor. Other difficulties have been experienced when the metallic sheet has been drilled and fabricated, as for example, insulating the walls of holes drilled through the metallic sheet sufficient to avoid shortcircuiting of electric leads from electric components passed through the board.

A still further obstacle to the design of a metal core printed circuit board has been the difficulty of having components in close enough contact with the circuit board so that heat generated in the components can pass readily to the metal core, serving in such instances as a heat sink, and at the same time have the components adequately insulated electrically from the electrically conducting metal core.

It is therefore an object of the invention to provide a new and improved metal core printed circuit board which is provided with an especially adequate layer of electrically insulating but thermally conducting coating of such character that a circuit pattern is applied to the coating in a dependable fashion whereby to result in a finished circuit board of precision character and capable of long life.

Still another object of the invention is to provide a new and improved metal core printed circuit board to the metal surface of which are applied multiple films of a synthetic plastic resin material wherein the resin is such that it will be tough and durable where left exposed, providing adequate electrically insulating properties, an which also is thin enough to pass heat, generated by components in the circuit, readily through the resin to the metal core to be carried away by conduction as the primary mode of heat transfer, notwithstanding the benefits of radiation and convection modes.

Still another object of the invention is to provide a new and improved metal core printed circuit board wherein the resin surface is in a special condition providing a keying bond between an initial metallic layer and the resin surface so that a hard, fast, durable and permanent bond will be achieved.

With these and other objects in view, the invention consists in the construction, arrangement, and combination of the various parts of the device, whereby the objects contemplated are attained, as hereinafter set forth and illustrated in the accompanying drawings.

In the drawings:

FIG. 1 is a fragmentary perspective view of a metal core subsequent to drilling and machining.

FIG. 2 is a fragmentary perspective view partially broken away showing the metal core after application thereto of an insulating coating, on line 2–2 of FIG. 1.

FIG. 3 is a fragmentary perspective view on the line 3–3 of FIG. 2, after the step of mechanical etching.

FIG. 4 is a fragmentary perspective view on the line 4–4 of FIG. 3 showing the condition of the insulating coating after the chemical etch.

FIG. 5 is a fragmentary cross-sectional view of the coating in a condition of the step following FIG. 4.

FIG. 6 is a fragmentary view of the insulating coating after a nucleating step.

FIG. 7 is a cross-sectional view showing the material in the same condition as in FIG. 6.

FIG. 8 is a fragmentary cross-sectional view showing the insulating coating after application of the first nickel layer is complete.

FIG. 15 is a perspective view partially in section similar to FIG. 10 but wherein a different method is employed for applying the circuit pattern.

FIGS. 16 and 17 are perspective views partially in section similar to FIG. 15 but showing respective successive steps in the production of the circuit pattern and removal of materials therebetween.

FIG. 18 is a fragmentary perspective view of a finished circuit board.

Figure 9:
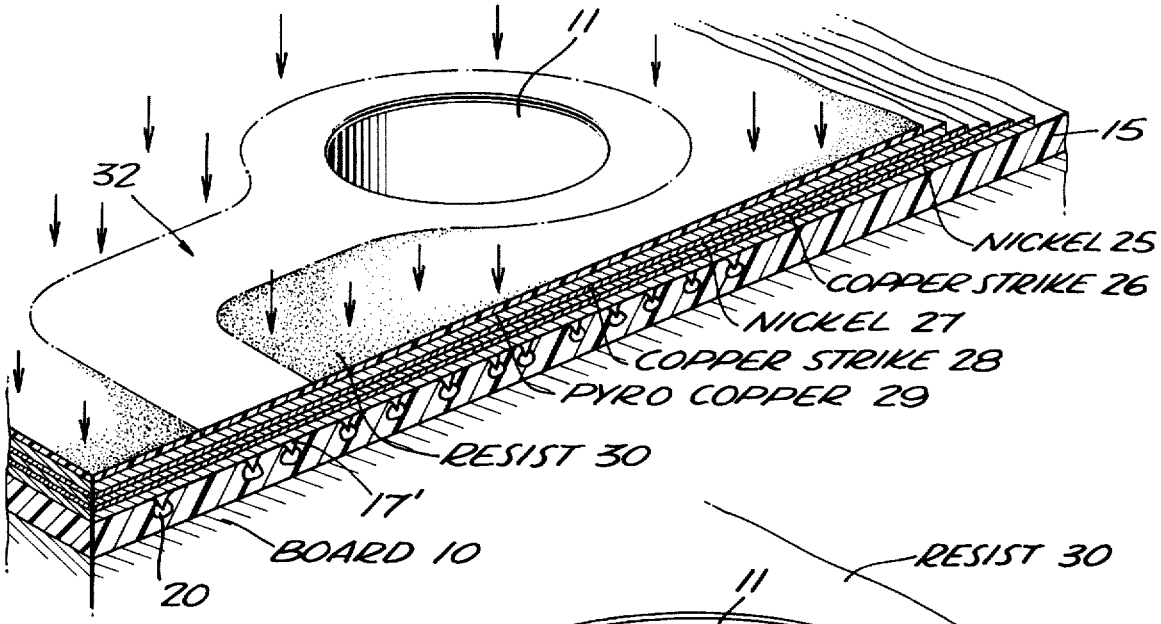
FIG. 9 is a perspective view partially in section showing the condition of the board after initial build-up of all of the layers of material.
Figure 10:
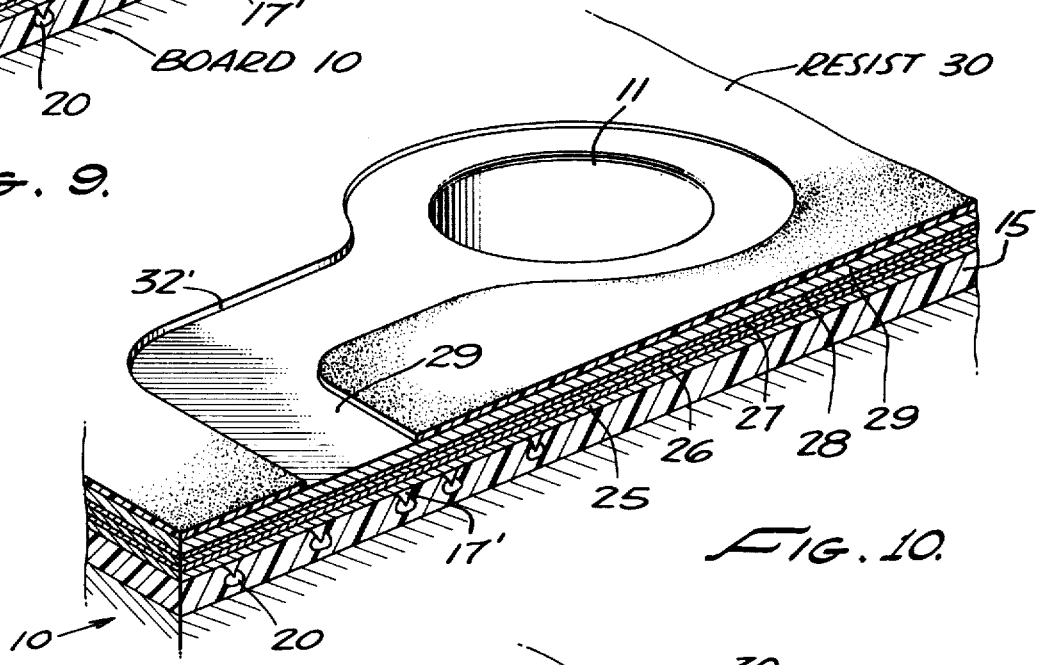
FIG. 10 is a perspective view partially in section similar to FIG. 9 illustrting the step following that shown in FIG. 9.
Figure 11:
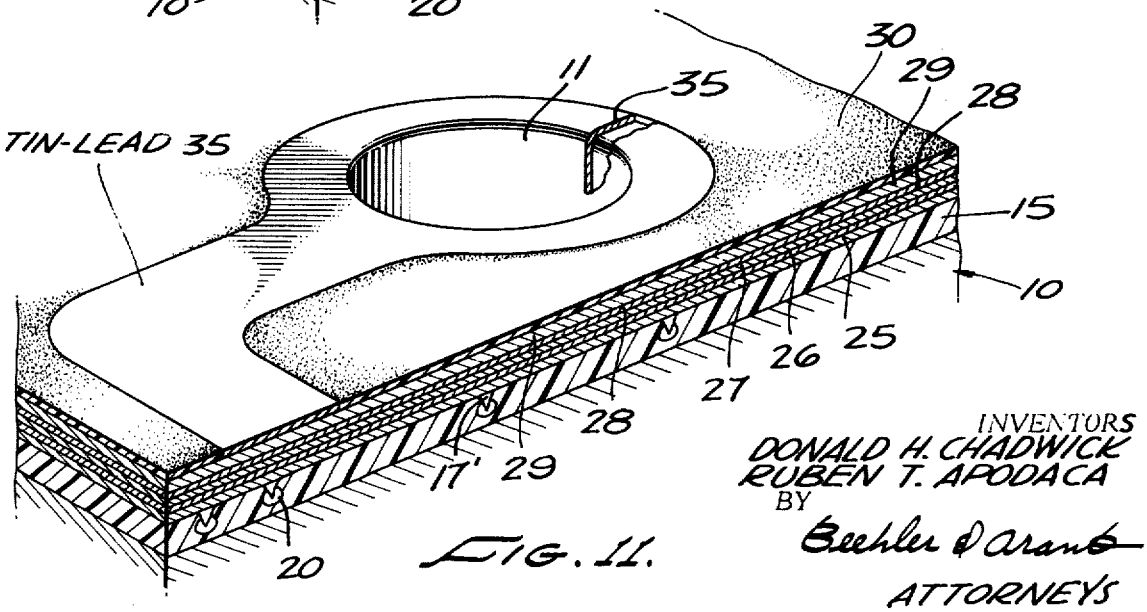
FIG. 11 is a perspective view partially in section similar to FIG. 10 wherein the build-up of the line of the circuit pattern has been completed.
Figure 12:
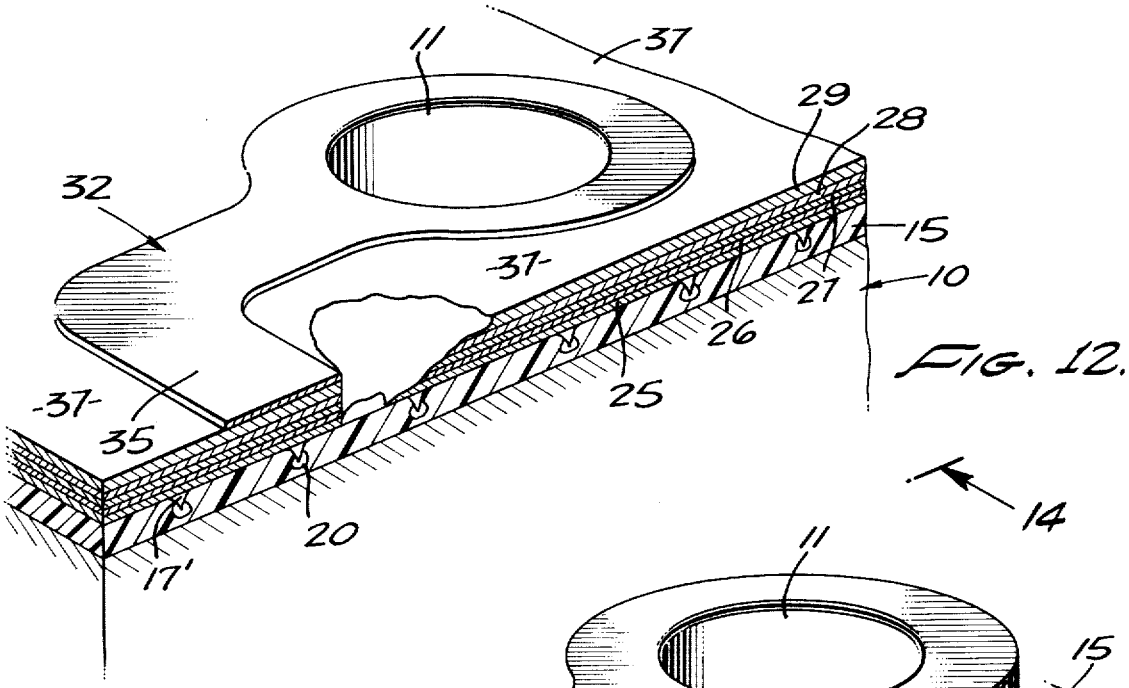
FIGS. 12 and 13 show fragmentary perspective views partially broken away similar to FIG. 11 illustrating successive steps for producing the finished circuit pattern which is illustrated in FIG. 13.
Figure 13:
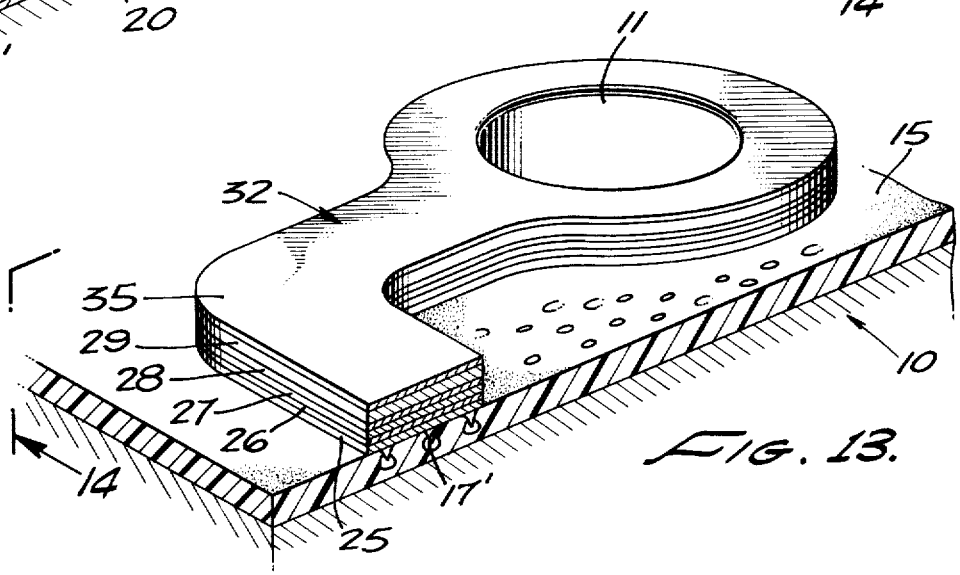

In an embodiment of the invention chosen for the purpose of illustration, there will be described a metal core printed circuit board which has an electrically conducting printed circuit pattern on both sides of the board, the circuit pattern being interconnected by means of conducting metal extending through holes in the board. It will be understood, however, that the technique which produces the product is readily applicable to a single surface where a single circuit pattern on one side is sufficient.

Customarily, the thickness of a printed circuit board is assumed to be the over-all finished thickness of the composite board, after the circuit pateern has been applied. For that reason the sheet of material, which in this instance is a metal sheet, is made slightly smaller than the expected finished thickness to allow a build-up of lines on one or both sides which will ultimately determine the finished thickness. Quite commonly, a finished printed circuit board is one which is 1/32 of an inch thick. Other thicknesses are prevalent, however, but irrespective of the relative thickness of the finished board, the process herein described of preparing it and applying to it an electrically conductive circuit is substantially the same.

In the chosen embodiment, where the finished board is to be 1/32 inch thick, the initial metal sheet should be approximately 0.025 inch thick to allow for the build-up of the sundry layers of material. Other sheets may be double, triple or even four times as thick in actual practice or may be thinner. Board thicknesses of less than 0.025 inch can be processed. The limiting factor is hole size to board thickness ratio. Processing has been limited to a finished hole of 0.020 inch in a 0.25 inch thick substrate. The nature of the electrically nonconducting coating application is such that hole diameters greater than 0.020 inch would allow thinner substrates to be used.

The metal sheet is preferably of aluminum because of its toughness, its thermal conducting ability, and other physical attributes which make it readily workable. Other kinds of metal however will also serve. A metal sheet 10 is initially trimmed to size and then drilled so as to provide the holes 11 which will be needed to interconnect circuit patterns on opposite sides of the sheet and also to permit the wire leads from electric components mounted on one side of the board to be extended through the board and electrically connected to a circuit pattern on the opposite side. In the sheet 10 only some of the holes 11 are shown and it should be understood that the precise location of the holes is coded so that when the printed circuit pattern is ultimately applied, it will encompass the holes in their initially drilled position.

It is also desirable to fabricate the sheet before any succeeding step is undertaken. This means deburring the holes 11 previously referred to and also preparing any other slots, cuts or sundry configurations, like for example the slot 12, the cutout portion 13, and the cut-off corner 14. These cutout portions are referred to merely by way of example, since each different circuit board will in all expectation be individually tailored to fit the cabinet in which it will be ultimately used.

Following fabrication, the sheet is etched in a caustic solution and then anodized. Anodizing amounts to a chemical surface treatment, the object being to make use of a treatment which will chemically clean the surface upon which subsequent applications of materials are to be made. Anodizing is a suitable surface preparation for aluminum, chemical conversion coatings such as the various chromate conversion films such as Iridite are suitable. Other metals such as copper, copper alloys, titanium, steel, magnesium, lithium-magnesium alloys or other base metals or alloys would require other or similar surface preparations to provide a receptive surface to promote coating adhesion to the metal substrate.

The sheet is now ready for application of an electrically nonconducting coating 15 which, in the present instance, is a coating of such character as to be capable of offering relatively a minimum amount of resistance to the transfer of heat to the sheet. In the chosen example, both sides of the sheet 10 are coated whereby to provide for the application of a circuit pattern to both sides. Initially, a primer is applied to both sides or surfaces of the sheet and over the primer are applied multiple successive, relatively thin coats of a synthetic plastic resin material containing an appropriate hardener, the consistency of which is thin enough so that each successive coat will be a very thin coat. While the actual number of successive coats of the synthetic plastic resin material is not critical, it has been found in practice that there should not be less than three coats and that as many as ten coats may be found desirable to achieve the needed physical, electrically nonconductive and thermally conductive properties which will be needed in the finished printed circuit board of the quality sought. It will be understood that the same multiple coats of synthetic plastic resin material will also be applied to the walls of the holes 11 which have been drilled through the board. A synthetic plastic resin material which is especially advantageous is polyurethane resin and a primer of desirable characteristics is a catalized primer such as described in MIL-P-15328B or MIL-P-24504A.

After the multiple layers of resin have been built up, the composite sheet, coated as described, is stabilized. Stabilization in the present instance contemplates heat curing at temperatures of from 150° to 220° C. for a period of about 72 hours. Curing as described stabilizes the resin and also makes it appreciably dense. In practice, it has been found that a curing such as that herein recommended produces a coating layer, the ultimate thickness of which is about 50% to 60% of the thickness when initially applied.

Since the synthetic plastic resin is depended upon to electrically insulate the metal core or sheet of metal material from the metallic lines of the circuit pattern and also to provide a base upon which the circuit pattern is to be built, it will be appreciated that the coating of the resin material must be durable and must also be one which will be compatible to a build-up of materials on it in such a manner that the materials when built upon it will be mechanically stable and not readily damaged or removed.

A multiple step procedure is found advantageous to prepare the surface of the synthetic plastic resin for the process. Initially, the surface of the coating 15, which in the present instance means the surface on both sides of the sheet, is sandblasted, preferably with No. 220 garnet particles and at a pressure of 50 to 100 pounds per square inch. Sandblasting mechanically creates a multiplicity of pockets 16, 17, 18 etc. throughout the surface, the pockets being of various shapes and sizes depending in part upon the size of the garnet particles, in part upon the pressure, and in part upon the concentration of particles when the sandblasting takes place.

After the sandblasting has been completed, the board is thoroughly cleaned, as for example, by a spray rinse or mechanical scrubbing, followed by application of an alkaline cleaner to remove any possible oils or greases which may have accumulated on the surface, followed by a clear water rinse. The next step is to chemically etch the mechanically etched surface. An acceptable chemical etch is a chromic type mixture in solution which is capable of eating into the resin material. The purpose of the chemical etching step is to form smaller pits in the bottoms of the pockets 16, 17, 18 etc. formed by the mechanical etching step as shown by the reference characters 16', 17', 18' etc. so that they are more capable of retaining materials which may be deposited into them and so that they will provide a keying effect for a material buildup. In practice, the surface of the resin is normally nonwettable and the successive etching steps hereinabove described are for the purpose of making it temporarily wettable for application of subsequently applied materials.

An acceptable chromic type mixture solution capable of chemically etching the mechanically etched surface of resin to a desirable degree consists of the following: Niklad #230 Etchant.

Following the successive etching steps, the coating is sensitized. This in the present disclosure comprises subjecting the coated board to a bath of "noble" metal salts, namely metallic salts in which agents are present to cause the metal from the salts, that is to say pure metal, to deposit on the surface and especially to deposit in the pockets 16', 17', 18' etc. which were created by the mechanical etch step followed by the chemical etch step. The effect of sensitizing as described is to cause tiny seeds 20 or pure metal to accumulate in the pockets created initially by the mechanical etch and subsequently enlarged.

A satisfactory "noble" metal is palladium in the form of palladium chloride. This is a solution having a pH of from 0.01 to 5 for example. Palladium is one of the more stable and long lasting of the noble metal salts. Although in fact expensive, such a relatively small quantity is needed to sinsitize a composite coated sheet of the kind described that the relatively high cost of metal is not a determining factor.

Following the deposit of the tiny metallic seeds 20 in the pockets, build-up of layers or films of materials on the surface of the resin commences. An initial step is to nucleate the surface prepared in the manner heretofore described. This means to interconnect the metal seeds 20 of palladium, which have been deposited in the pockets. An acceptable material for this interconnection has been found to be nickel in the form of a nickel salt solution using a boron reduction system. Other solutions are also acceptable, as for example, those described in Pats. 2,532,283, [2,767,723] *2,762,723* and 2,935,425. What is accomplished by the foregoing step is to commence a growth 21 of nickel upon the seeds 20 left by the sensitizing step so that the nickel growing as described fills the pockets and expands over the outside edges of the pockets over the surface of the resin material.

In practice it is a growth in patches 22 within which are appreciable bare spots 23. Hence to nucleate alone will not provide a dependable nickel surface over the entire resin material. Consequently, the nucleating step is immediately followed by an electroless nickel deposit. This means subjecting the previously nucleated surface to an electroless nickel bath of a more rapid plating rate to build up thickness sufficient for electrical conductivity, namely a layer 25.

The layer of nickel 25 is from about 10 to about 50 millionths of an inch thick. The nickel covered board is then dipped in a weak acid for cleaning purposes. Such a weak acid being, for example, 2 to 10% sulfuric acid solution. Following this treatment the board is again rinsed.

Different types of markets demand ultimately different types of printed circuit boards. One type of market can be met by providing a board the circuit pattern of which is formed, built up, and cleared in accordance with the following procedure.

The layer of nickel 25 formed, as previously described, is subjected to a copper strike. This consists of building up a film 26 of copper upon the nickel to a depth of 20 to 100 millionths of an inch by making use of a copper pyrophosphate bath or other suitable strike bath. Such a bath results in the deposit of only a very small amount of copper but does not produce a copper film wherein there is good adhesion. After the copper strike which resiults in providing a film of copper over the entire surface, the surface of the copper is cleaned. In production it has been found that, if semi-finished raw materials are to be inventoried in quantity, the semi-finished material can best be handled by carrying the process through to the end of the copper strike, after which the boards may be stored. If there is no need for storage, then a cleaning step will follow the application of the copper strike immediately rather than at some future date when the inventoried boards are to be used.

The succeeding step is an electroplating step wherein a second layer 27 of nickel is electroplated to the copper strike, as for example, by employment of a nickel sulfamate bath. Nickel plating over the copper strike serves the purpose of forming a barrier film to prevent dissolution of the electroless nickel deposit by the copper electroplating bath.

From here on, if the board is to be shifted from one tank to another, the next step will be a 2% to 10% sulfuric acid rinse which, however, may be omitted when the process is to be carried on continuously in the same tank. The exposed surface of the second nickel layer 27 is then subjected to a pyro-copper strike, this being accomplished by immersing the board, coated to the extent that it has now become, in a pyrophosphate copper solution for about 30 to 90 seconds, to build up a layer 28 of thickness of about 10 to 50 millionths of one inch of copper of the type referred to.

Pyrophosphate copper is then plated on the pyro-copper strike by electroplating in a pyrophosphate copper solution long enough to build up the required thickness. The thicker built up pyrophosphate copper layer is identified by the reference character 29. Following the copper build-up the board is cleaned with pure water and by physically scrubbing the board with a mild abrasive, followed then by a spray rinse. After cleaning, the surface of the pyrophosphate copper is subjected to a mild etch of ammonium persulfate.

The built up multiple metal layers are now ready for application of a resist 30 which, in terms of the trade, means a light-sensitive or photo-sensitive, emulsion. After the emulsion is coated on, it is cured, using care not to expose the coating to ultraviolet light.

In the first described method sequence, the photo-resist or light-sensitive emulsion is next covered by a photographic negative (not shown) and the surface of the photo-resist exposed to ultraviolet light. This creates a circuit pattern 31 (FIG. 18) which means a pattern of lines 32, 33 etc. which will ultimately be the conducting lines of an electric circuit. In this step the electric circuit is a positive image. Where the ultraviolet light has hit the area of the photo-resist, the photo-resist will be hardened and resistant to plating solutions, clean-up solvents and solvents in general. The lines 32, 33, however, which are created by the positive of the image, which will be the lines where the circuit is to be traced, are not subjected to the ultraviolet light and will remain soft.

Following exposure to create the circuit pattern 31, the surface is dipped in a developing solvent. The developer dissolves the lines which constitute the surface pattern, the photo-resist in that line pattern being washed away and exposing the pyrophosphate copper 29 beneath it. The remaining coating is dyed so that the operator will have something which can be visually inspected for imperfections. After such inspection by the operator, excess developer is washed off as by a spray rinse, the surface then hving the water dried from it, and subsequently cured in an oven at a temperature of, for example, 100° C., for up to ½ hour in time. The step last described produces a hard surface on the board which can be handled. It is now time for touching up pin holes which may exist in the conducting circuit pattern, physical imperfections, damage, defects in the negative, dust particles falling upon the pattern, and perhaps other defects. The touch-up is done by use of a paint brush to paint on a compatible material such as an asphalt or vinyl paint.

Now that the circuit pattern consists of recessed lines 32' etc. which reveal bare pyrophosphate copper, they are in condition to have applied thereto another unlike or different metal. Commonly, an acceptable unlike metal is a tin-lead mixture which is applied in layers 35 to the exposed pyrophosphate copper to a thickness of 0.0005 to 0.0003 inch. Another acceptable metal is gold, except that when gold is used, applied to the exposed pyrophosphate copper, the thickness will be built up only 80 to 100 millionths of an inch.

Figure 14:
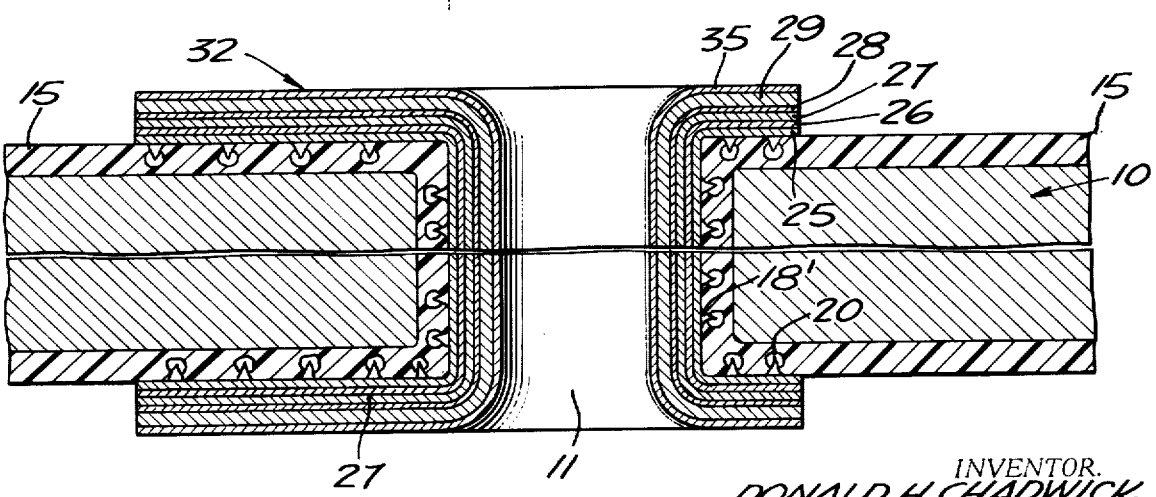
FIG. 14 is a cross-sectional view on the line 14–14 of FIG. 13 showing the build-up of materials in one of the holes.

Once the exposed pyrophosphate copper circuit pattern 31 has been covered with the unlike metal 35, the resist is then removed from the spaces intermediate the lines of the circuit pattern. This is accomplished in a conventional manner by use of what is commonly called a "resist stripper." After the resist has been removed as described, the surface is cleaned by a spray rinse to be centain that no resist remains. Removing the resist lays bare the surface of pyrophosphate copper 29 over all portions except those where the overlying unlike metal, such as tin-lead, has been applied. Throughout all of the preceding steps it should be borne in mind that the metallic layers are being built up on the walls of the holes which go through the sheet as well as on the surface or surfaces of the sheet. Where there are circuit pattern lines on both sides, the multiple layers of metal build-up will coat the wall of each hole 11 and form a bridge or connection between the lines of the surface pattern on one surface of the sheet and lines of the surface pattern on the other surface of the sheet, as shown in FIG. 14.

With the resist having been removed from intermediate areas 37 of pyrophosphate copper, the composite sheet is then ready for etching. Etching may take place in an appropriate bath, as for example, a ferric chloride solution, an ammonium persulfate solution, or a chromic-sulphonic acid solution. The selection of the solution will depend upon what the overplating or overlying unlike metal is on the board. For example, if the unlike metal were tin-lead, then a chromic-sulphuric solution would be used. If gold were the unlike metal, then a ferric chloride solution would be used. Although ferric chloride solution is cheaper, such a ferric chloride solution would not be used where the unlike material is tin-lead because ferric chloride would affect the lead and destroy the overplating. Etching as described takes away all of the copper and the nickel layers and leaves the lines 32, 33 etc. of the circuit pattern 31 on the surface by themselves. The etching away clears all of the spaces between the lines 32, 33 etc. of all metals leaving only the bare surface of the synthetic plastic resin coating 15.

The composite printed circuit board is then cleaned to the extent of cleaning of the entire surface so that all acids and/or salts have been neutralized and removed, and the product is then ready for use by having appropriate electronic components (not shown) applied thereto, and leads (not shown) extended through the holes 11 and soldered to the lines of the circuit pattern on the opposite side of the sheet.

SILK SCREEN PROCESS

In a second form of the invention the circuit pattern may be applied by means of a silk screen process. In this form of the invention, the steps of the process already described are followed partially through, to and including the pyrophosphate copper strike and pyrophosphate copper build-up followed by the customary cleaning by physically scrubbing the board with a mild abrasive and spray rinse followed by a mild etch using a material such as ammonium persulfate. At this point the process changes in that resist is applied by a conventional silk screen process in such a manner that the circuit pattern is left bare with the exposed surface of pyrophosphate copper build-up defining the circuit pattern whereas the resist, applied by means of the silk screen process fills the spaces intermediate the lines of the circuit pattern. A cross-sectional view of the build-up of layers at this stage will be similar to that of FIG. 9 except for the build-up having been arrived at without the step of printing from a photographic negative and washing off the resist from the circuit pattern.

Thereafter the overplating or application of unlike metal such as tin-lead or gold to the exposed pyrophosphate copper is carried on in the same manner as previously described, followed by removal of the resist and subsequent etching away of the metal layers initially covered by the resist, down to but not through the coating of resin.

THIN COPPER PROCESS

In still another form of the invention which is somewhat more economical of materials and process time, the initially described steps of the process are repeated up to and through the pyrophosphate copper strike over the nickel plating. By this third form there is in fact a pyrocopper film or layer applied but the strike is not followed up at this point by a build-up in thickness of pyrophosphate copper.

Thereafter the board is cleaned as previously described by scrubbing the board with a mild abrasive, then spray rinsing followed by a mild etch using, for example ammonium persulfate, or in other words, cleaning and deoxidizing. The photo-resist is then applied to the thin layer of pyrophosphate copper strike, the emulsion cured as heretofore described, and then exposed to ultraviolet light through a negative, thereby to create a positive circuit pattern on the resist. In the alternative at this point, the positive circuit pattern may be created by the silk screen process, previously described, wherein the areas intermediate the circuit pattern are filled with a resist leaving the pyrophosphate copper exposed in the circuit pattern. Again the process throughout all of the steps heretofore defined takes place inside of the holes on the walls of the holes, as well as on the surfaces.

Here again the resist is dried, cured and the circuit pattern touched up as previously described.

In this third form of the invention, the material is cleaned in a mild alkaline solution, as for example, to remove fingerprints and comparable blemishes, and activated, as for example, by means of a deoxidizing step with ammonium persulfate solution. In either of the alternatives, last made reference to, the pyrophosphate copper material is laid bare in a receptive condition in the circuit pattern so that the next step which is the build-up step for the pyrophosphate copper can take place only in the circuit pattern. In other words, the copper build-up is confined to the circuit pattern and not to the entire surface of the board.

Following the build-up the circuit pattern is overplated much as previously described with another unlike metal, tin-lead or gold, in the example chosen for illustration.

The resist is then removed by employment of a substantially conventional resist stripper thereby to bare the surface of the thin layer 28 of pyrophosphate copper strike which heretofore has been located beneath the resist. The surface is then cleaned by spray rinse, for example, to be sure that all resist is completely removed and the cleaning followed by etching. Although the etching step for this form of the process is similar to that initially described, wherein ferric chloride or ammonium persulfate or chromic sulphuric acid is suggested, depending upon the metal used for the overplate, the etching requirement is less strenuous in that only a very thin layer 28 of pyrophosphate copper need be removed by etching instead of a built up thickness like the layer 29. Thereafter, as etching progresses, the copper strike 26 first applied is removed and the layer 25 of electroless nickel baring as previously the surface of the resin coating 15 which is left intact.

From the foregoing description it will be appreciated that in the last decribed form of the invention several saving features are taken advantage of. The pyrophosphate copper is built up only in the circuit pattern, thereby saving appreciably in the application of the copper, and in the etching step only a very thin film of pyrophosphate copper needs to be etched away. Despite these savings, the circuit pattern itself and all lines of it are built up to the same desirable degree and structure as in the initially described form of the process.

While the invention has herein been shown and described in what is conceived to be a practical and effective embodiment, it is recognized that departures may be made therefrom within the scope of the invention.

Having described the invention, what is claimed as new in support of Letters Patent is:

1. A metal core printed circuit board comprising a sheet of metal having a thickness slightly less than the thickness of a standard complete printed circuit board, a base film of synthetic plastic resin forming a coating extending over at least one surface of said sheet, said coating having a roughened surface texture comprising a multiplicity of keying depressions, a circuit pattern on said coating comprising conducting metallic lines, said metallic lines comprising a base layer of nickel in keyed bonded engagement with said coating and the depresions therein, a film of copper in electroplated engagement with said nickel, an outer layer of nickel in electroplated engagement with said film of copper, a layer of pyrophosphate copper in bonded engagement with said last identified layer of nickel, and an overlying layer of metal unlike said copper and nickel in adhesive engagement with said pyrophosphate copper, there being spaces between said conducting metallic lines wherein said coating is exposed and said metal core is covered by said coating.

2. A metal core printed circuit board as in claim 1 wherein said base layer of nickel comprises a nickel deposit having initially applied portions in said keyed bonded relationship with the coating and other subsequently applied portions extending between said initially applied portions.

3. A metal core printed circuit board as in claim 1 wherein holes extend through the metal core and said coating extends throughout walls of said holes.

4. A metal core printed circuit board as in claim 3 wherein said holes communicate with said conducting metallic lines and portions of the material comprising said conducting metallic lines extend into the holes and are secured to the walls of said holes.

5. A metal core printed circuit board as in claim 1 wherein said coating and said circuit pattern is on both sides of said sheet.

6. A metal core printed circuit board as in claim 5 wherein holes through the sheet interconnect with the circuit pattern on both sides of the sheet and portions of the material comprising said conducting metallic lines extend through the holes and interconnect said lines.

7. A metal core printed circuit board as in claim 1 wherein said base film comprises a plurality of layers of successively applied films of heat cured polyurethane resin [separated by a primer] *and wherein only the layer of resin nearest the metal is separated from the metal by a primer.*

8. A metal core printed circuit board as in claim 7 wherein there are not less than six layers of said resin.

* * * * *